United States Patent [19]
Finney et al.
[11] Patent Number: 4,903,170
[45] Date of Patent: Feb. 20, 1990

[54] HOUSING ARRANGEMENTS FOR ELECTRICAL OR ELECTRONIC EQUIPMENT

[75] Inventors: Alwyn Finney, Warwick; Michael Whitlam, Coventry, both of England

[73] Assignee: The General Electric Company, p.l.c., England

[21] Appl. No.: 281,100

[22] Filed: Dec. 7, 1988

Related U.S. Application Data

[63] Continuation of Ser. No. 113,537, Oct. 26, 1987, abandoned.

[30] Foreign Application Priority Data

Oct. 27, 1986 [GB] United Kingdom ................ 8625648

[51] Int. Cl.[4] .............................................. H05K 9/00
[52] U.S. Cl. ................................ 361/424; 174/35 R; 361/415
[58] Field of Search ............... 361/346, 395, 399, 412, 361/413, 415, 424, 212, 220; 211/41; 174/35 R, 35 C, 35 GC, 35 MS

[56] References Cited

U.S. PATENT DOCUMENTS

| | | | |
|---|---|---|---|
| 3,816,911 | 6/1974 | Knappenberger | 174/35 R |
| 3,904,937 | 9/1975 | Levin | 361/415 |
| 4,134,631 | 1/1979 | Conrad | 361/415 |
| 4,203,147 | 5/1980 | Gabr | 361/424 |
| 4,301,494 | 11/1981 | Jordan | 361/415 |
| 4,370,515 | 1/1983 | Donaldson | 174/35 R |
| 4,464,544 | 8/1984 | Klein | 361/424 |
| 4,631,641 | 12/1986 | Brombal | 361/424 |
| 4,716,493 | 12/1987 | Zelkowitz | 361/424 |
| 4,751,613 | 6/1988 | Werdin | 361/415 |

*Primary Examiner*—Gerald P. Tolin
*Attorney, Agent, or Firm*—Kirschstein, Ottinger, Israel & Schiffmiller

[57] ABSTRACT

A housing arrangement for equipment, such as telephone exchange equipment or transmission equipment, in which individual circuit units are formed on printed circuit boards mounted side-by-side on a shelf unit, wherein the shelf unit forms a first electromagnetic screening enclosure, and interconnections between said circuit units, external connections to those units, are made by way of a second electromagnetic screening enclosure having one face in common with the first enclosure.

3 Claims, 2 Drawing Sheets

1
2
8
6
3
4

2
1
8
6
7

20
22
6
22

12
19
23
14
2
15
16
17
9
10
8
18
18
8
20
8
8
1
11
13
6
21
21

HOUSING ARRANGEMENTS FOR ELECTRICAL OR ELECTRONIC EQUIPMENT

This is a continuation of application Ser. No. 113,537, filed Oct. 26, 1987, now abandoned.

BACKGROUND OF THE INVENTION

Field of the Invention

The present invention relates to housing arrangements for electrical or electronic equipment.

In particular, although not exclusively, the invention is concerned with housing arrangements for electrical or electronic equipment, for example telephone exchange equipment or transmission equipment, in which individual electrical or electronic circuits or circuit units are formed on respective ones of a plurality of printed circuit boards mounted side-by-side in parallel planes on a common support structure, the circuits on the respective boards being arranged to be connected by way of respective plug and socket connectors to interconnecting circuits carried on a common back plane.

SUMMARY OF THE INVENTION

According to one aspect of the present inventionn in a housing arrangement for electrical or electronic equipment in which a plurality of equipment units are detachably interconnected by way of a common interconnection unit, said equipment units are arranged to be substantially enclosed within a first electromagnetic screening enclosure and said common interconnection unit is arranged to be substantially enclosed within a second electromagnetic screening enclosure.

Preferably external connections to said equipment units are made by way of said common interconnection unit within said second enclosure.

According to another aspect of the present invention a housing arrangement for electrical or electronic equipment comprises first and second electromagnetic screening enclosures having one face in common, means detachably to mount a plurality of equipment units in said first enclosure, and means in said second enclosure to mount an interconnection unit, said common face being provided with apertures for plug and socket type connectors whereby said equipment units may be detachably connected to said interconnection unit.

Preferably said equipment units are provided with electromagnetic screening front panels which together complete a front face of said first enclosure.

According to another aspect of the present invention electrical or electronic apparatus comprises a first electromagnetic screening enclosure, a plurality of electrical or electronic equipment units, means detachably to mount said equipment units within said first enclosure, a second electromagnetic screening enclosure having one face in common with said first enclosure, interconnecting means within said second enclosure, and respective plug and socket connectors arranged detachably electrically to connect said equipment units to said interconnecting means through said common face between said enclosures.

Preferably said equipment units are provided with front panels which form respective parts of a front face of said first enclosure.

BRIEF DESCRIPTION OF THE DRAWINGS

Housing arrangements for electronic equipment in accordance with the present invention will now be described by way of example with reference to the accompanying drawings, of which.

DETAILED DESCRIPTION OF THE PREFERRED EMBODIMENTS

In many forms of electronic equipment, such as that used in telephone exchange systems or in transmission systems, individual electronic circuits or circuit units are formed on printed circuit "cards" of standard sizes, which are interconnected and to which external connections are made by means of respective plug and socket type connectors. A plurality of these cards are arranged to be supported side by side on a shelf structure with their general planes vertical and parallel to one another, the upper and lower edges of the cards being located in guide members or runners into which the cards may be introduced by sliding movement from the front of the shelf structure. The respective plug connectors are disposed at the rear of the cards, as positioned within the shelf structure, while the corresponding socket connectors are mounted on a common transverse back-plane which also supports any required interconnecting wiring. Where the equipment requires it several shelves of standard heights, depth and width may be supported one above the other in a rack framework, and two or more rack frameworks may stand side by side.

As the individual circuit units become more compact and as clock-pulse rates and signal frequencies become higher, sensitive circuits have to be screened more carefully from stray electromagnetic fields or radiation which could interfere with their operation, and potential sources have to be screened as far as possible to prevent such radiation from reaching sensitive circuits. Standards are now being set for the levels of radiation screening acceptable in newly installed equipment.

Figure 1:
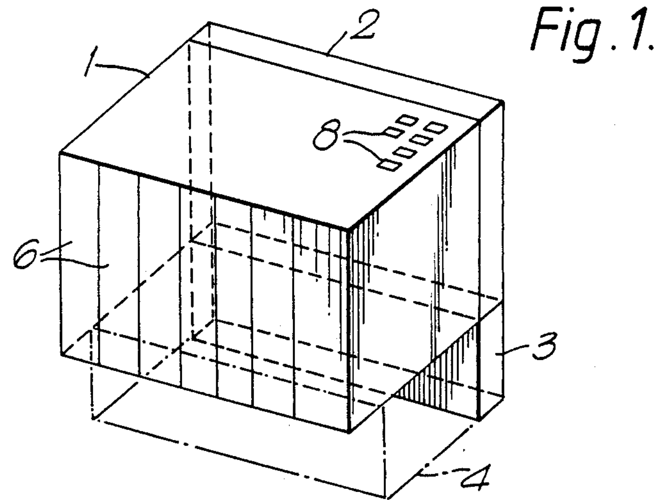
FIGS. 1 and 2 show schematically two different forms of housing arrangement.
Figure 2:
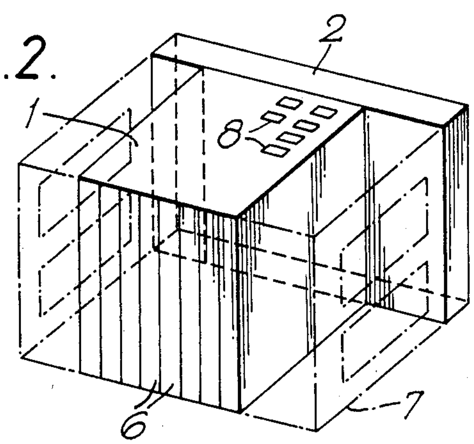

Referring now to FIGS. 1 and 2, which show in outline two different shelf structures, the circuit cards (not shown) supported by the shelf structures are housed within a first enclosure 1, while the back plane (not shown) is enclosed within a second enclosure 2. In the case of the structure outlined in FIG. 1 the circuit cards occupy the whole width of the structure, and the enclosure 2 is provided with a downward extension 3 which provides a forward facing surface for external connection points. This extension 3 may have the same depth as the enclosure 2, as shown in outline, or may extend forward as indicated by the chain-dotted outline 4. The enclosure 2 may alternatively be extended upwards (not shown) to provide the required forward facing surface.

In the case of the structure outlined in FIG. 2, where the circuit cards do not occupy the full width of the structure, so that the enclosure 1 is narrower than the enclosure 2, the unoccupied forward facing surfaces of the enclosure 2 may provide sufficient area for the required external connections. The structure may be provided with side frames 7 at full shelf width, for example for mounting purposes.

Figure 3:
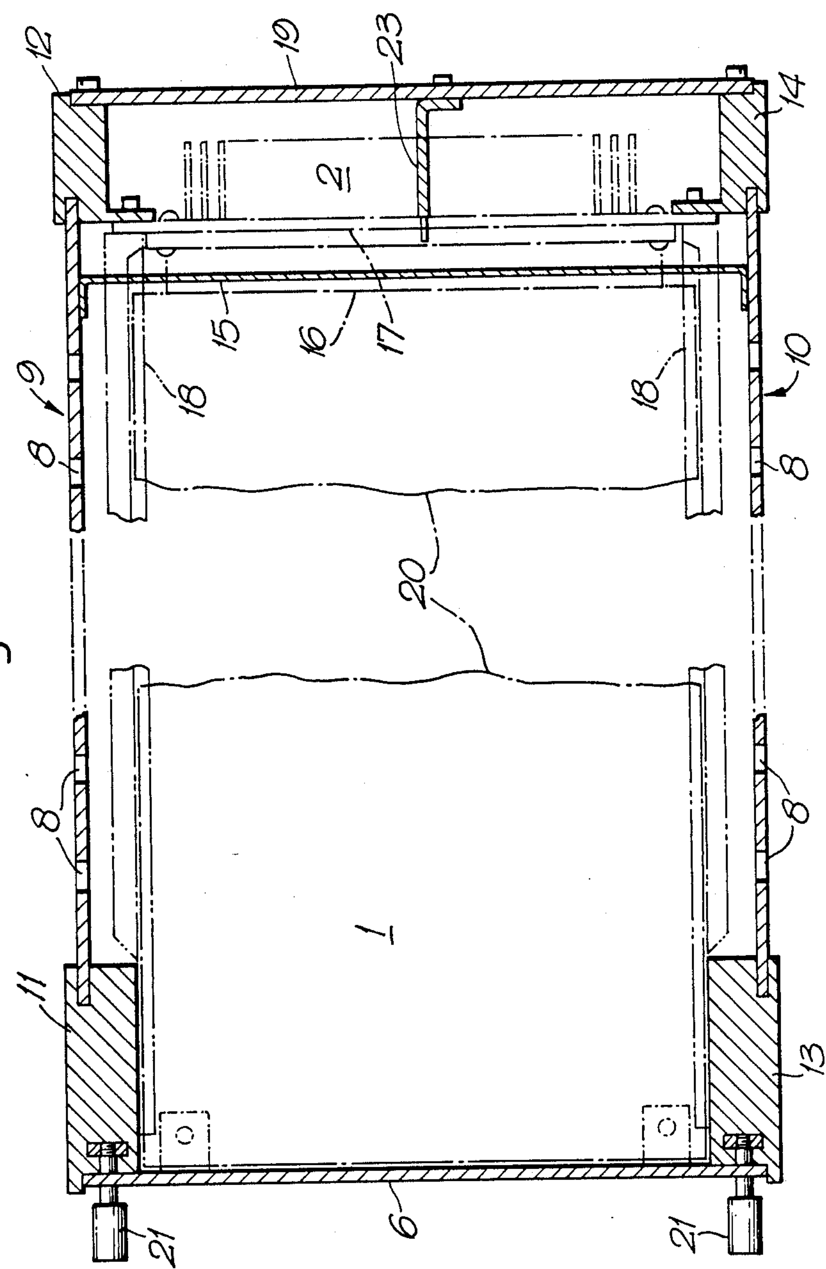
FIG. 3 shows a part-sectional view of part of a housing arrangement.

As far as possible the two enclosures 1 and 2 are divided from one another by an internal electromagnetic screen member (15 see FIG. 3). The front face of the enclosure 1 is made up of individual front panels 6 associated with the individual circuit cards. The enclosure 1, and the enclosure 2 if necessary, may be provided with apertures 8 to provide for a flow of cooling air. These apertures 8 may be example be provided in the upper and lower faces of the enclosure 1, and may be arranged in a regular pattern of which only a small part is indicated in FIGS. 1 and 2.

Referring now to FIG. 3 the enclosure 1 is made up of upper and lower shelf screen members 9 and 10 which extend between upper and lower horizontal aluminium alloy extrusion members 11, 12, 13 and 14. An internal screen member 15 is secured to the upper and lower screen members 9 and 10, this member 15 being pierced substantially only by the apertures required for socket connectors 16, which are secured to a back plane member 17, and for the rear ends of card runners 18. The enclosure 2 is formed by the member 15, the rear edges of the members 9 and 10, the extrusion members 12 and 14 and a rear shelf screen 19.

Figure 4:
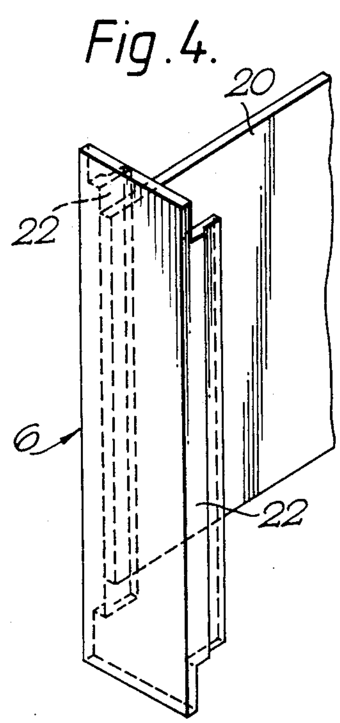
FIG. 4 shows a detail isometric view of part of a housing arrangement.

The front panel 6 of each printed circuit card 20 is secured to the upper and lower extrusion members 11 and 13 by card retaining screws 21. As shown in FIG. 4 each front panel 6 has its edges 22 formed to lie parallel with its printed circuit card 20 and with the edges of adjacent panel members 6, and an electrically conductive spring finger strip, say, of beryllium copper (not shown) is secured to these edges 22 to provide electrical continuity between the front panels 6.

The intervals between any fixing screws or rivets (not shown) used in the assembly of the enclosures 1 and 2, and the dimensions of the apertures 8, are chosen to be much smaller than the wavelength of the highest frequencies expected to be produced or utilised within the enclosures 1 and 2, or those to which electronic circuits within these enclosures may be sensitive, in order to reduce to a specified level any leakage out or in at these or lower frequencies. In a particular example the intervals between screws or rivets was 50 mm or less, and the apertures 8 were 10 mm wide and 20 mm long, the enclosures providing screening attenuation of 50-60 dB up to frequencies of 20 MHz.

The larger apertures in the screen member 15, dictated by the dimensions of the sockets 16, may give rise to some leakage, but the effects of this are minimised either by the screening effect of the second enclosure 2, by filtering, or by the use of intermediate screens such as 23 (FIG. 3).

While electromagnetic screening is provided by the almost total enclosure described above, electrostatic screening requires that all the members forming the enclosures 1 and 2 be in good electrically conductive contact with one another. For this purpose the screen members, which may be fabricated for example from aluminium alloy, and the extrusion members, are coated with an electrically conductive corrosion resistant finish.

Any indicator lights, switches or connectors provided in the front panels 6 in general require only small holes in the panels, causing substantially no leakage or radiation at the higher frequencies.

Shelf structures of the forms described above may either be arranged as stand-alone units or may be dimensioned for mounting on any standard rack framework. The front panels 6 may be covered by a full-width transparent cover.

We claim:

1. A housing arrangement for electrical equipment providing electromagnetic screening for said electrical equipment at frequencies up to a predetermined upper frequency, comprising: first and second electromagnetic screening enclosures; fixing means utilized in assembling said enclosures which are spaced at intervals less than the wavelength of said upper frequency; a plurality of carrier means for units of said electrical equipment, each said carrier means including a front cover and respective first connector means; means detachably to mount said carrier means within said first enclosure such that said front covers of said plurality of carrier means together make up a substantially electrically continuous front panel of said first enclosure; an electromagnetic screening member forming a rear face of said first screening enclosure and at least part of a front facing surface of said second screening enclosure; a plurality of second connector means co-operable with respective first connector means to extend connections from respective units of electrical equipment on respective carrier means in said first enclosure into said second enclosure; means to mount external connection means on said forward facing surface of said second enclosure; and means within said second enclosure to make connections between respective second connector means and said external connection means.

2. Electrical apparatus in accordance with claim 1, wherein said electrical equipment units comprise electric circuit cards.

3. Electrical apparatus in accordance with claim 1, wherein said second connector means are mounted so as to extend through said one facing surface.

* * * * *